United States Patent [19]  [11] 4,376,986
Elmasry et al.  [45] Mar. 15, 1983

[54] DOUBLE LAMBDA DIODE MEMORY CELL

[75] Inventors: Mohamed I. Elmasry, Waterloo, Canada; LuVerne R. Peterson, San Diego, Calif.

[73] Assignee: Burroughs Corporation, Detroit, Mich.

[21] Appl. No.: 307,158

[22] Filed: Sep. 30, 1981

[51] Int. Cl.³ .............................................. G11C 13/00
[52] U.S. Cl. .................................... 365/159; 365/189
[58] Field of Search ................ 365/189, 230, 149, 159

[56] References Cited
U.S. PATENT DOCUMENTS
4,143,286  3/1979  Kolke et al. ......................... 365/159

Primary Examiner—Terrell W. Fears
Attorney, Agent, or Firm—Charles J. Fassbender; Kevin R. Peterson

[57] ABSTRACT

Disclosed is an improved static memory cell comprised of first and second conductive means for carrying respective bias voltages in the cell, a third conductive means for carrying an input/output voltage signal in the cell, and a Lambda diode coupled between the first and third conductive means for there providing a negative dynamic resistance whenever the input/output voltage signal is within a predetermined range between the bias voltages on the first and second conductive means, with the improvement being a voltage dependent resistance means coupled between the second and third conductive means for there providing a negative dynamic resistance in response to at least some of the input/output voltages within said range.

9 Claims, 6 Drawing Figures

DOUBLE LAMBDA DIODE MEMORY CELL

BACKGROUND OF THE INVENTION

This invention relates to static semiconductor memories for storing digital information; and more particularly it relates to such memories constructed out of Lambda diodes.

By definition, a static semiconductor memory is a memory in which stored information does not deteriorate as a function of time. When a digital "one" or a digital "zero" is stored in a static memory cell, that information remains unchanged until it is written differently or until power is removed from the memory cell. By comparison, information in a dynamic semiconductor memory must be periodically "refreshed;" otherwise, the information deteriorates and becomes lost.

Also by definition, a Lambda diode is a two-terminal device consisting of a pair of interconnected complementary depletion mode field effect transistors. One of those terminals is interconnected to the drain of the N-channel transistor and the gate of the P-channel transistor; and the other terminal is interconnected to the drain of the P-channel transistor and the gate of the N-channel transistor. Both the P-channel transistor and the N-channel transistor also have their sources interconnected together.

One prior art publication in which the Lambda diode is described is, "The Lambda Diode: A Versatile Negative Resistance Device," Kano et al., *Electronics*, June 26, 1975, pp. 105–109. There, the two transistors within the Lambda diode are described as being either junction field effect transistors (JFET) or insulated gate field effect transistors (IGFET). Also, the current-voltage (I-V) characteristic curve of the Lambda diode and several applications of the diode are described.

Those applications include a static memory cell. It is illustrated in FIG. 7 on page 109 of the publication and it is redrawn herein as FIG. 1. Note that the operation of that memory cell is not illustrated or described in the reference, but the operation is illustrated herein as FIG. 2 and is described below.

In FIG. 1, the Lambda diode is indicated by reference numeral 10; one of its terminals is indicated by reference numeral 11; and the other terminal is indicated by reference numeral 12. Symbol $Q_N$ indicates the N-channel transistor in the Lambda diode and symbol $Q_P$ indicates the P-channel transistor in the Lambda diode.

Current into terminal 11 is supplied through an enhancement mode P-channel transistor 13. That transistor has both its source and its gate connected to a conductor 14 to receive a bias voltage $V_{dd}$. Thus, since transistor 13 is a P-channel device, that transistor is always turned off; and so only a leakage current passes through transistor 13 to terminal 11.

Terminal 11 is also where information is held in the memory cell. That information is in the form of either a "high" voltage or a "low" voltage. This voltage is stored during a write operation and read during a read operation by means of an access transistor 15, a bit line 16, and a word line 17.

Transistor 15 is an enhancement mode P-channel field effect transistor having its source connected to terminal 11, its drain connected to bit line 16, and its gate connected to word line 17. Bit line 16 is electrically connected to terminal 11 wherever the voltage on word line 17 is at least one threshold voltage below the voltage on bit line 16. Otherwise, terminal 11 is electrically isolated from bit line 16.

Consider now FIG. 2 wherein the detailed operation of the FIG. 1 memory cell is illustrated. There a curve 20 gives the I-V characteristics of the Lambda diode 10; and a curve 21 gives the I-V characteristics of transistor 13. Another curve 22 also exists, but it will be described subsequently in conjunction with a modification of the above memory cell.

Inspection of curve 20 shows that Lambda diode 10 exhibits a relatively low static resistance as the voltage on terminal 11 is increased from ground to a voltage $V_P$. Thereafter, the Lambda diode exhibits a substantial increase in static resistance as the voltage on terminal 11 is further increased past voltage $V_P$ to a voltage $V_V$. This increase is so large that the dynamic resistance of Lambda diode 10 is negative between voltages $V_P$ and $V_V$. Then, as the voltage is increased still further to the bias voltage $V_{dd}$, the Lambda diode exhibits a relatively high static resistance and passes only a leakage current.

This shape of curve 20 is explained as follows. When the voltage on terminal 11 is between zero volts and voltage $V_P$, transistors $Q_N$ and $Q_P$ are both on. That is, the gate-to-source voltage of transistor $Q_N$ is negative but smaller in magnitude than that transistor's negative threshold $V_{TN}$; and the gate-to-source voltage of transistor $Q_P$ is positive but smaller in magnitude than that transistor's positive threshold $V_{TP}$. Thus, as the voltage on terminal 11 increases from zero volts to voltage $V_P$, the current through the Lambda diode N also increases.

By comparison, as the voltage on terminal 11 increases from voltage $V_P$ to voltage $V_V$, transistors $Q_N$ and $Q_P$ both begin to turn off. And when the voltage on terminal 11 equals voltage $V_V$, the gate-to-source voltage of transistor $Q_N$ and the gate-to-source voltage of transistor $Q_P$ respectively equal their threshold voltage. Voltage $V_V$ is thus defined as the magnitude of the threshold voltage for transistor $Q_N$ plus the magnitude of the threshold voltage for transistor $Q_P$.

Finally, when the voltage on terminal 11 is between voltage $V_V$ and voltage $V_{dd}$, transistors $Q_N$ and $Q_P$ are both turned off. Under this condition, only leakage current flows through Lambda diode 11.

Considering now curve 21, it can be seen that the current through transistor 13 is always very small, regardless of the voltage on terminal 11. This is because, as explained above, transistor 13 is always turned off. To repeat, transistor 13 is a P-channel device so it therefore needs a negative gate-to-source voltage to turn on. But since the gate of transistor 13 is connected to voltage $V_{dd}$, the gate-to-source voltage of transistor 13 is always zero.

Inspection of FIG. 2 further shows that curves 20 and 21 intersect each other at three points labeled 23a, 23b, and 23c. Points 23a and 23c are stable operating states in the memory cell. In state 23a, a low voltage is stored in the cell; whereas in state 23c a high voltage is stored in the cell.

Point 23b, by comparison, is an unstable operating point; so it is not used to store information in the cell. Instead, point 23b is entered when information is read from the cell. In a read operation, bit line 16 is charged like a capacitor to the voltage at point 23b. Then transistor 15 is turned on so the charged bit line 16 is interconnected to node 11. Then, if a low voltage is stored on node 11, bit line 16 discharges slightly; whereas if a high voltage is stored on node 11, then bit line 16 charges slightly.

Suppose, for example, that a low voltage is stored at node 11. Then after bit line 16 is charged to the voltage at point 23b and transistor 15 is turned on, the voltage on bit line 16 will be reduced slightly to a voltage such as that indicated in FIG. 2 by reference numeral 23b'.

At that lower voltage, the current through Lambda diode 10 is greater than the current through transistor 13. This is evident from curves 20 and 21. And the extra current through Lambda diode 10 causes bit line 16 to discharge.

As a result, the voltage on bit line 16 drops even further. But at this new voltage, the current through Lambda diode 10 is even greater than the current through transistor 13. So bit line 16 discharges even faster. This process continues until after a relatively short time interval, point 23a is reached.

By comparison, suppose that a high voltage is stored in the memory cell. This voltage is also read by precharging bit line 16 to the voltage at point 23b and thereafter turning on transistor 15. When that occurs, the voltage on terminal 11 increases slightly to a voltage such as that indicated by reference numeral 23b" in FIG. 2.

Curves 20 and 21 show that at voltage 23b''', transistor 13 supplies slightly more current than Lambda diode 10 can sink. Therefore, the extra current passing through transistor 13 operates to further charge bit line 16. Thus the voltage on bit line 16 rises slightly to another voltage. This process then continues until bit line 16 is charged to the voltage at point 23c.

But a problem with this charging operation is that the difference between the current supplied by transistor 13 and the current sunk by Lambda diode 10 is very small. This is evident by inspection of the righthand portion of curves 20 and 21 in FIG. 2. Therefore, only a small current is left over for charging bit line 16, and consequently it takes a long time to charge bit line 16 all the way up to the voltage at point 23c.

From the above, it is apparent that the "low" state of the FIG. 1 memory cell can be read relatively quickly; but the "high" state of the memory cell takes a long time to read. But since during a read operation it is not known whether a "high" state or a "low" state is stored, a long time interval must always be provided for the reading operation. Thus, the FIG. 1 memory is deficient in that the read takes too long.

This deficiency may be overcome by modifying the FIG. 1 memory such that the current through transistor 13 is greatly increased. That is, transistor 13 could intentionally be made to be very leaky. Or alternatively, transistor 13 could be replaced with a depletion mode transistor. In either case, the current through transistor 13 would be as indicated by curve 22 in FIG. 2 rather than curve 21.

Curve 22 intersects curve 20 at three points, 24a, 24b, and 24c. Points 24a and 24c are stable operating points and thus represent information stored in the memory cell; whereas point 24b is an unstable operating point. Information would be read from this modified memory cell by precharging the bit line to the voltage corresponding to point 24b, and thereafter turning on transistor 15.

Then the voltage on bit line 16 would move from point 24b to either the left or the right depending upon whether a "low" or a "high" voltage is stored in the memory cell. In either case, as the operating point is moved, a large difference would exist between the current supplied by transistor 13 and the current sunk by Lambda diode 10. Therefore, both a "low" state and a "high" state would be read relatively quickly.

But a problem with this modified memory cell is that at operating point 24a, a relatively high current passes through transistor 13 and Lambda diode 10. Therefore, the memory cell in that "low" state dissipates a relatively large amount of power. This, of course, is undesirable because memory cells typically are used in arrays comprising thousands of cells. Consequently, the maximum power dissipation of a memory chip can readily be exceeded if the power dissipation per cell is not made extremely small.

Accordingly, it is a primary object of the invention to provide an improved static semiconductor memory having both a relatively low power dissipation and relatively short read time in comparison to the prior art.

BRIEF SUMMARY OF THE INVENTION

This object and others are achieved in accordance with the invention by an improved static memory cell which includes first and second conductive means for carrying respective bias voltages in the cell, a third conductive means for carrying an input/output voltage signal in the cell, and a Lambda diode coupled between the first and third conductive means for there producing a negative dynamic resistance whenever the input/output voltage signal is within a predetermined range between the bias voltages on the first and second conductive means. Also included as the improvement within the memory cell is a voltage dependent resistance means coupled between the second and third conductive means for there producing a negative dynamic resistance in response to at least some of the input/output voltages within said range. In one preferred embodiment, this voltage dependent resistance means is another Lambda diode which consists of either a pair of insulated gate field effect transistors or a pair of junction field effect transistors.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 3:
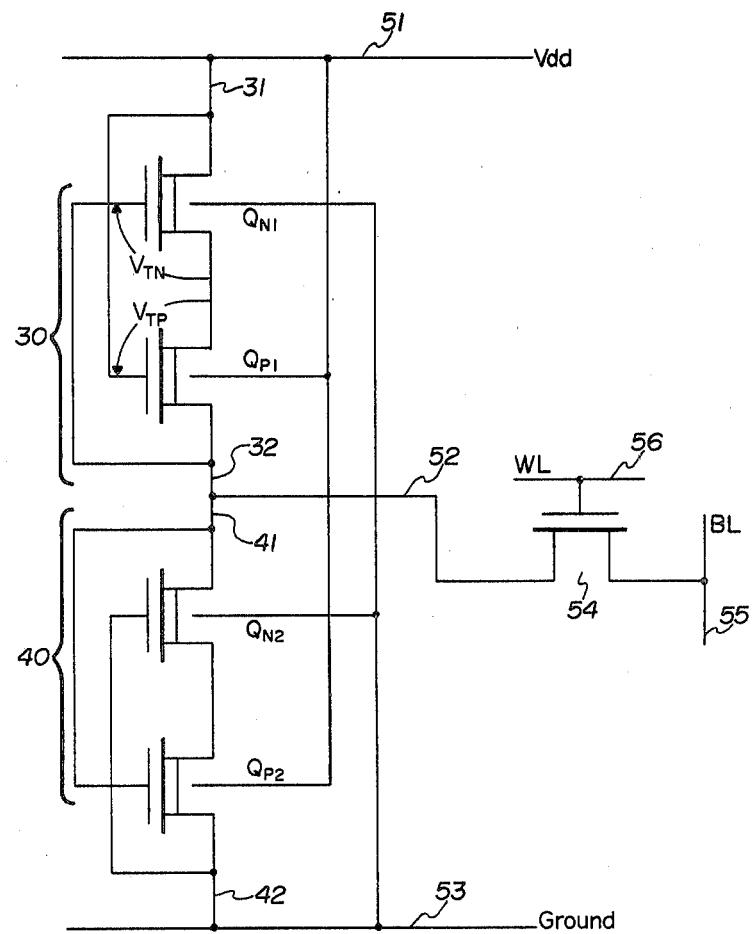
FIG. 3 is a detailed circuit diagram of one preferred embodiment of a static memory cell constructed according to the invention which incorporates two Lambda diodes.

Referring now to FIG. 3, one preferred embodiment of the invention will be described in detail. This embodiment includes a pair of Lambda diodes 30 and 40 which are interconnected as illustrated. Symbol $Q_{N1}$ indicates the N-channel depletion mode field effect transistor within Lambda diode 30; and symbol $Q_{P1}$ indicates the P-channel depletion mode field effect transistor within Lambda diode 30. Similarly, symbol $Q_{N2}$ indicates the N-channel field effect transistor within Lambda diode 40; and symbol $Q_{P2}$ indicates the P-channel depletion mode transistor within Lambda diode 40.

One terminal 31 of Lambda diode 30 connects to a conductor 51 which carries a bias voltage $V_{dd}$. That terminal 31 also interconnects the gate of transistor $Q_{P1}$ and the drain of transistor $Q_{N1}$. Another conductor 52 which carries an input/output voltage signal to the memory cell, connects to the other terminal 32 of Lambda diode 30. Terminal 32, in turn, interconnects the gate of transistor $Q_{N1}$ and the drain of transistor $Q_{P1}$.

One terminal 41 of Lambda diode 40 also connects to conductor 52. And terminal 41 in turn interconnects the gate of transistor $Q_{P2}$ with the drain of transistor $Q_{N2}$. The other terminal 42 of Lambda diode 40 connects to another conductor 53 which carries a ground bias voltage. Terminal 42 also interconnects the gate of transistor $Q_{N2}$ and the drain of transistor $Q_{P2}$.

Information is written into and read from the FIG. 3 memory cell by means of an enhancement mode N-channel transistor 54, a bit line 55, and a word line 56. During a write operation, the voltage on word line 56 is made high to turn transistor 54 on; and simultaneously, the voltage on bit line 55 is selectively made either relatively high or relatively low, depending upon the voltage that is desired to be written into the memory cell.

During a read operation, bit line 55 is precharged to a voltage midway between the "high" and "low" voltage states of the memory cells. Then transistor 54 is turned on. And then the precharged voltage on bit line 55 either increases or decreases depending upon whether a "high" voltage or "low" voltage was stored in the memory cell.

This reading and writing of the memory cell will now be described in greater detail with reference to FIGS. 4, 5, and 6. First, beginning with FIG. 4, there is illustrated a set of curves 30a and 40a which respectively indicate the I-V characteristics of Lambda diodes 30 and 40. That is, curve 30a shows the current through Lambda diode 30 as the voltage on terminal 32 changes from ground to the bias voltage $V_{dd}$. Similarly, curve 40a shows the current through Lambda diode 40 as the voltage on terminal 41 changes from ground to the bias voltage $V_{dd}$.

Figure 2:
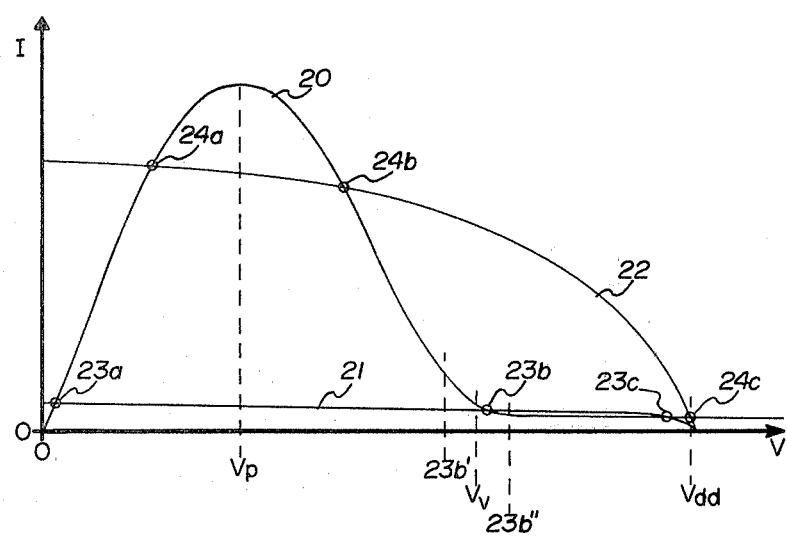
FIG. 2 is a set of curves illustrating the operation of the memory cell of FIG. 1.

By inspection of curve 40a it can be seen its shape is identical to the shape of the previously described curve 20 of FIG. 2. So how the shape of curve 40a comes about needs no further explanation. But by comparison, curve 30a is shaped as the mirror image of curve 40a. This is explained as follows.

Figure 4:
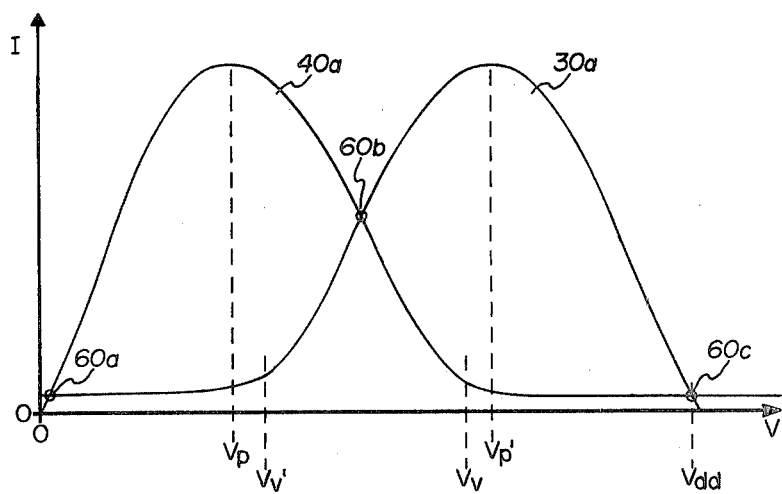
FIG. 4 is a set of curves illustrating the operation of the FIG. 3 memory cell.

Consider first the condition where the voltage on terminal 32 lies between bias voltage $V_{dd}$ and a lower voltage $V_{P'}$ as indicated in FIG. 4. Under that condition, the gate-to-source voltage of transistor $Q_{N1}$ and the gate-to-source voltage of transistor $Q_{P1}$ are such that both of those transistors are fully turned on. Thus Lambda diode 30 exhibits a relative low static resistance, and current through that diode increases as the voltage across it increases.

Next, consider the operation of Lambda diode 30 as the voltage on terminal 32 changes from voltage $V_{P'}$ to voltage $V_{V'}$. In that voltage range, both of the transistors $Q_{N1}$ and $Q_{P1}$ begin to turn off. And when the voltage on terminal 32 equals $V_{V'}$, the gate-to-source voltage of transistor $Q_{N1}$ and the gate-to-source voltage of transistor $Q_{P1}$ equal the respective threshold voltages of those transistors.

Stated differently, the difference between bias voltage $V_{dd}$ and voltage $V_{V'}$ equals the magnitude of the threshold voltage of transistor $Q_{N1}$ plus the magnitude of the threshold voltage of transistor $Q_{P1}$. And when the voltage on terminal 32 lies between $V_{V'}$ and $V_{P'}$, diode 30 exhibits a negative dynamic resistance.

Finally, consider the condition where the voltage on terminal 32 lies between voltage $V_{V'}$ and zero volts. Under that condition, both of the transistors $Q_{N1}$ and $Q_{P1}$ are fully off. Thus, diode 30 acts as a high resistance device which passes only a leakage current.

Further inspection of curves 30a and 40a in FIG. 4 shows that those curves intersect each other at three points, 60a, 60b, and 60c. Points 60a and 60c are stable operating points; and thus the voltage at terminals 32 and 41 at those points represents information stored in the memory cell. That is, the voltage at point 60a is the "low" voltage state of the memory cell whereas the voltage at point 60c is the "high" voltage state of the memory cell.

Point 60b, by comparison, is an unstable operating point. Thus, it is not utilized to store information in the memory cell; but instead it is entered to read information from that cell. This read operation occurs as follows.

To begin, bit line 55 is precharged to the voltage corresponding to point 60b. Thereafter, the voltage on word line 56 is raised to turn on transistor 54. Consequently, if a "high" voltage was stored on terminals 32 and 41, that voltage will drop to a voltage just to the right of the voltage at point 60b.

But curves 30a and 40a show that if the voltage at terminals 32 and 41 moves just slightly to the right of point 60b, then the current through Lambda diode 30 will be substantially greater than the current through Lambda diode 40. Thus, a large excess current will flow through transistor 54 to charge bit line 55.

In turn, that charging of bit line 55 further increases the voltage at terminals 32 and 41; which further increases the difference between the respective currents through Lambda diodes 30 and 40. Thus, bit line 55 quickly charges to the "high" point 60c.

Conversely, suppose that a "low" voltage is stored in the memory cell at terminals 32 and 41. Then, after bit line 55 has been precharged to the voltage at point 60b and transistor 54 has been turned on, the voltage at terminals 32 and 41 will change to a voltage slightly to the left of point 60b.

But curves 30a and 40a show that when the voltage on terminals 32 and 41 is just slightly to the left of point 60b, Lambda diode 40 sinks substantially more current than Lambda diode 30 supplies. And this large excess current which Lambda diode 40 sinks operates to quickly discharge bit line 55. So the voltage on bit line 55 quickly drops to the voltage at point 60a.

Figure 1:
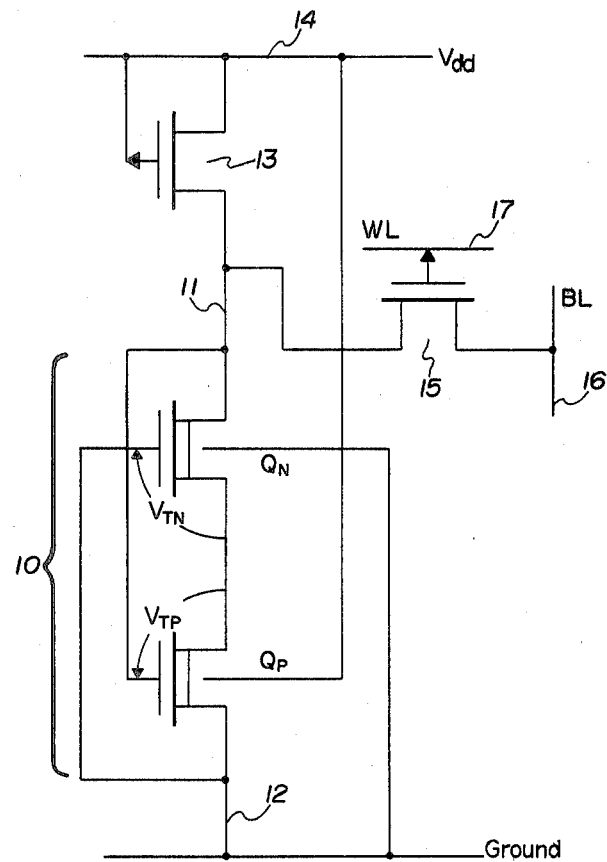
FIG. 1 is a detailed circuit diagram of a prior art static memory cell which incorporates only one Lambda diode.

From the above analysis, it is evident that the reading of information from the memory cell of FIG. 3 occurs relatively quickly in comparison to the reading of information from the prior art memory cell of FIG. 1. And at the same time, the power dissipation in the memory cell of FIG. 3 is relatively low. This is because, as curves 30a and 40a show, the current at both points 60a and 60c is very small. Consequently, the FIG. 3 memory cell is a substantial improvement over the prior art because it has both a fast read operation and low power dissipation.

Note that there is an upper limit to bias voltage $V_{dd}$. The upper limit equals the sum of the magnitude of the respective threshold voltages for transistors $Q_{N1}$, $Q_{P1}$, $Q_{N2}$, and $Q_{P2}$. This constraint, as FIG. 4 shows, ensures that voltage $V_{V'}$ of curve 30a is less than voltage $V_V$ of curve 40a. In other words, it ensures that the respective voltage ranges in which Lambda diodes 30 and 40 exhibit their negative dynamic resistance overlap. Thus the crossover point 60b occurs as illustrated.

For similar reasons, a lower limit on bias voltage $V_{dd}$ also exists. Due to this constraint, bias voltage $V_{dd}$ must be greater than the sum of the threshold voltages for transistors $Q_{N1}$ and $Q_{P1}$; and it must also be greater than the sum of the threshold voltages for transistors $Q_{N2}$ and $Q_{P2}$. This ensures that when the memory cell is in its "low" voltage state, the voltage drop across Lambda diode 30 will be sufficient to turn that diode completely off; and when the memory cell is in its "high" voltage state, the voltage drop across Lambda diode 40 will be sufficient to turn that diode completely off.

Figure 6:
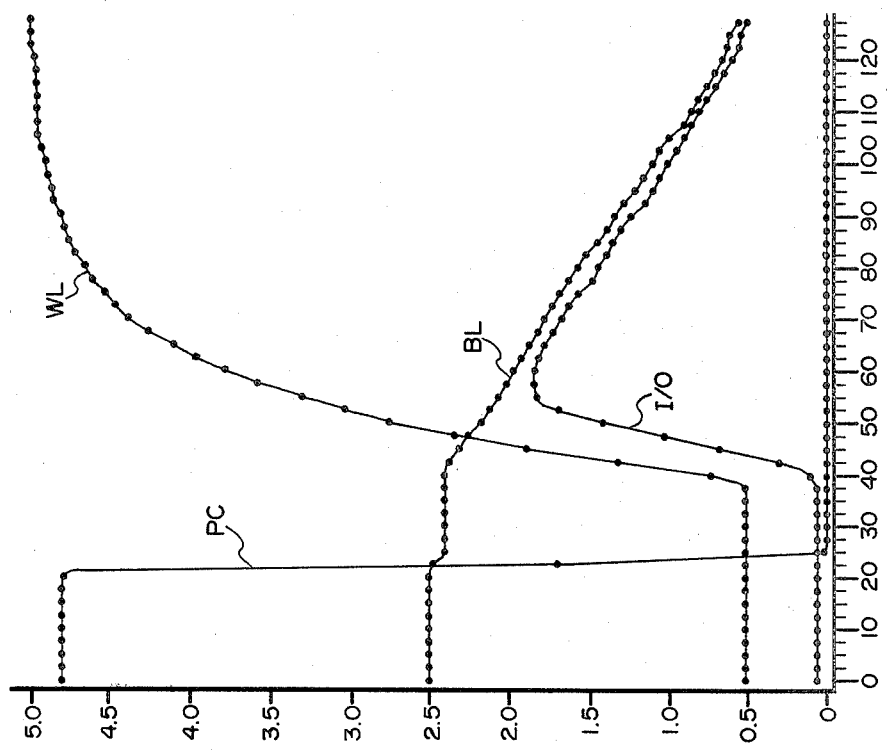
FIGS. 5 and 6 are a set of curves illustrating a computerized simulation of the FIG. 3 memory cell.
Figure 5:
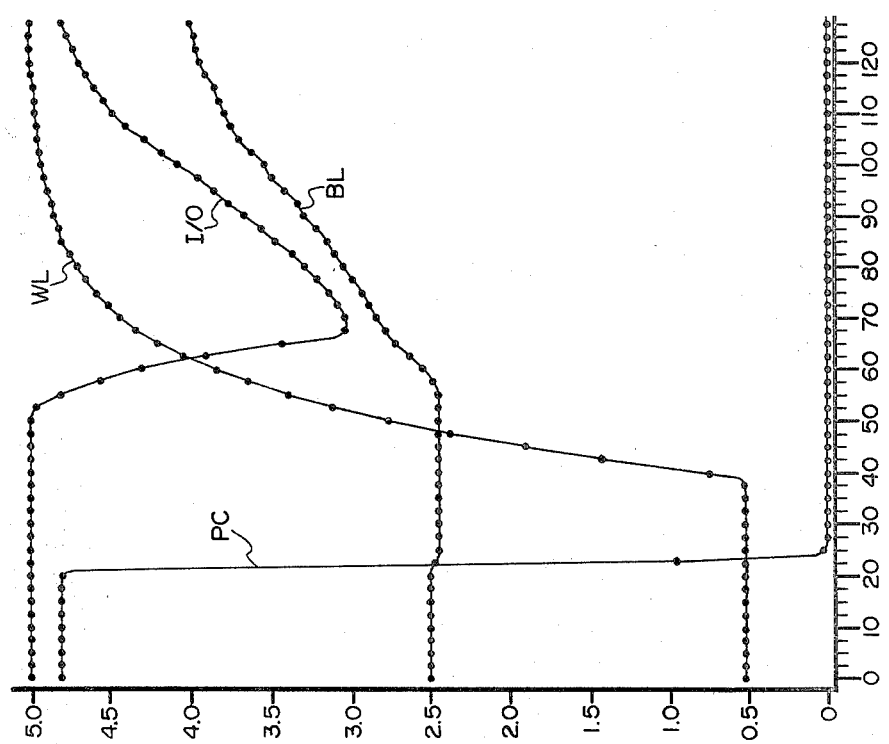

Turning now to FIGS. 5 and 6, those Figures respectively illustrate a computerized simulation of the reading of the "high" and "low" voltage state in the FIG. 3 memory. In this simulation, each of the transistors $Q_{N1}$, $Q_{P1}$, $Q_{N2}$, and $Q_{P2}$ had minimum length/width geometries of 2.5 um/2.5 um. Also, transistors $Q_{N1}$ and $Q_{N2}$ each had a threshold voltage of +2 volts; while transistors $Q_{P1}$ and $Q_{P2}$ each had a threshold of −2 volts.

Also in this simulation, bit line 55 was assumed to have a capacitance of 0.5 pf. This is about the capacitance one would expect in a memory chip containing 64,000 of the FIG. 3 memory cells. Also, bias voltage $V_{dd}$ was set at 5 volts.

In these Figures, time is plotted on the horizontal axis and voltage is plotted on the vertical axis. On the horizontal axis, the number 10 indicates 10 nanoseconds, the number 20 indicates 20 nanoseconds, etc. And on the vertical axis, the number 1 indicates 1 volt, the number 2 indicates 2 volts, etc.

Each of the FIGS. 5 and 6 contains a set of four curves which are respectively labeled WL, BL, I/O, and PC. Curve WL indicates the voltage on word line 56; curve BL indicates the voltage on bit line 55; and curve I/O indicates the voltage on terminals 32, 41, and conductor 52. The remaining curve PC indicates the gate voltage on a transistor (not shown) which is utilized to connect a precharge voltage to the bit line.

Inspection of FIG. 5 shows that signal PC is high during the time interval of 0 to 20 nanoseconds, and so bit line voltage BL is precharged to 2.5 volts. Thereafter, signal PC goes low to isolate the precharging voltage source from the bit line. Then, at a time of about 40 nanoseconds, word line voltage WL goes high to turn on transistor 54.

In response thereto, the "high" voltage state that was stored in the memory cell drops towards the precharge voltage that was stored on the bit line, and the precharge voltage rises toward the "high" voltage state. Then, since more current is being supplied through Lambda diode 30 than Lambda diode 40 can sink, the voltage on both the bit line and the I/O line rises together towards $V_{dd}$.

Similarly, in FIG. 6, during the time interval between 0 and 20 nanoseconds, the bit line is precharged to 2.5 volts. Thereafter, signal PC goes low to isolate the precharging voltage source from the bit line. And then at a time of about 40 nanoseconds, the word line voltage WL goes high to turn on transistor 54.

In response thereto, both the bit line voltage and the "low" voltage state that was stored in the memory cell move toward each other. Then, since Lambda diode 40 sinks more current than Lambda diode 30 supplies, both the bit line voltage and the I/O voltage decrease toward 0 volts.

One important point which these curves verify is that the rate at which the memory cell can be read is relatively fast. This is evident because the slope of the bit line signal BL after transistor 54 turns on is quite steep. Also, that slope is steep regardless of whether a "low" or "high" state is being read.

One preferred embodiment of the invention has now been described in detail. In addition, however, it is to be understood that many modifications and changes can be made to this embodiment without departing from the nature and spirit of the invention. For example, while the embodiment of FIG. 3 has been drawn with insulated gate field effect transistors, those transistors could also be replaced with junction field effect transistors. Also, while the embodiment of FIG. 3 has been described as having a ground bias voltage on conductor 53 and a positive bias voltage $V_{dd}$ on conductor 51, the ground bias voltage could be applied to conductor 51 and a negative bias voltage $-V_{dd}$ applied to conductor 53. Also, as another alternative, sense amplifiers could be connected to the bit line of the memory cell of FIG. 3. Those sense amplifiers would operate in their conventional manner to sense and amplify any initial change of the bit line voltage after transistor 54 is turned on.

Accordingly, since many such modifications and changes can be made to the described preferred embodiment, it is to be understood that the invention is not limited to those details but is defined by the appended claims.

What is claimed is:

1. An improved memory cell comprised of:
   first and second conductive means for carrying respective bias voltages in said cell;
   a third conductive means for carrying an input/output voltage signal in said cell;
   a Lambda diode coupled between said first and third conductive means for there providing a negative dynamic resistance whenever said input/output voltage signal is within a predetermined range between said bias voltages on said first and second conductive means;
   wherein the improvement comprises a voltage dependent resistance means coupled between said second and third conductive means for there providing a negative dynamic resistance in response to at least some of said input/output voltages within said range.

2. An improved memory cell according to claim 1 wherein said voltage dependent resistance means between said second and third conductive means is anothe Lambda diode.

3. An improved memory cell according to claim 2 wherein said another Lambda diode consists of an insulated gate P-channel transistor and an insulated gate N-channel transistor.

4. An improved memory cell according to claim 2 wherein said another Lambda diode consists of a junction field effect P-channel transistor and a junction field effect N-channel transistor.

5. An improved memory cell according to claim 2 wherein each of said Lambda diodes in said cell consists of a P-channel transistor and an N-channel transistor with all of said transistors having respective threshold voltages of the same magnitude.

6. An improved memory cell according to claim 2 wherein each of said Lambda diodes in said cell consists of a P-channel transistor and an N-channel transistor with all of said transistors having channels of the same width/length ratio.

7. An improved cell comprised of:
first and second conductive means for carrying respective bias voltages in said cell;
a third conductive means for carrying an input/output voltage signal in said cell;
wherein the improvement comprises a first voltage dependent resistive means coupled between said first and third conductive means and a second voltage dependent resistive means coupled between said second and third conductive means for providing between their respective conductive means a negative dynamic resistance for some range of input/output voltage signals on said third conductive means which lies within the bias voltage on said first conductive means and the bias voltage on said second conductive means.

8. An improved memory cell according to claim 7 wherein said first voltage dependent resistive means is a Lambda diode.

9. An improved cell according to claim 7 wherein said second voltage dependent resistive means is a Lambda diode.

* * * * *